US 12,211,708 B2

(12) United States Patent
Yasuda et al.

(10) Patent No.: US 12,211,708 B2
(45) Date of Patent: *Jan. 28, 2025

(54) SUBSTRATE PROCESSING APPARATUS AND SUBSTRATE PROCESSING METHOD

(71) Applicant: SCREEN Holdings Co., Ltd., Kyoto (JP)

(72) Inventors: Shuichi Yasuda, Kyoto (JP); Kenji Kobayashi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/523,474

(22) Filed: Nov. 29, 2023

(65) Prior Publication Data

US 2024/0096651 A1   Mar. 21, 2024

Related U.S. Application Data

(63) Continuation of application No. 16/473,077, filed as application No. PCT/JP2017/042645 on Nov. 28, 2017, now Pat. No. 11,881,417.

(30) Foreign Application Priority Data

Jan. 18, 2017 (JP) .................. 2017-006405

(51) Int. Cl.
*H01L 21/02* (2006.01)
*B01F 23/40* (2022.01)
(Continued)

(52) U.S. Cl.
CPC ........ *H01L 21/67023* (2013.01); *B01F 23/40* (2022.01); *B01F 23/45* (2022.01);
(Continued)

(58) Field of Classification Search
None
See application file for complete search history.

(56) References Cited

U.S. PATENT DOCUMENTS 11,881,417 B2 *  1/2024  Yasuda ............ H01L 21/67023
2003/0170949 A1   9/2003  Chouno et al.
(Continued)

FOREIGN PATENT DOCUMENTS

JP     H09-232273 A    9/1997
JP     2002-205022 A   7/2002
(Continued)

OTHER PUBLICATIONS

Merriam-Webster Dictionary definition of "circulation".*
(Continued)

*Primary Examiner* — Mikhail Kornakov
*Assistant Examiner* — Ryan L Coleman
(74) *Attorney, Agent, or Firm* — OSTROLENK FABER LLP

(57) ABSTRACT

First and second concentration measurement parts (415, 425) are provided in first and second supply liquid lines (412, 422) in which first and second supply liquids flow, respectively. A dissolved concentration of gas in the second supply liquid is lower than that in the first supply liquid. In the first and second supply liquid lines, respective one ends of first and second branch lines (51, 52) are connected to respective positions on the upstream side of the concentration measurement parts. The other ends of the first and second branch lines are connected to a mixing part (57), and by mixing the first and second supply liquids, a processing liquid is generated. Respective flow rate adjustment parts (58) of the first and second branch lines are controlled on the basis of respective measured values of the first and second concentration measurement parts so that the dissolved con-
(Continued)

centration of the gas in the processing liquid can become a set value. It is thereby possible to prevent the supply liquid containing particles or the like caused by the concentration measurement part from being contained into the processing liquid to be supplied to a substrate and also to adjust the dissolved concentration of the gas in the processing liquid to the set value with high accuracy.

7 Claims, 6 Drawing Sheets

(51) Int. Cl.
    *B01F 23/45*           (2022.01)
    *B01F 23/454*        (2022.01)
    *B08B 3/00*           (2006.01)
    *H01L 21/67*          (2006.01)
    *B01F 35/221*        (2022.01)
    *B01F 35/83*          (2022.01)

(52) U.S. Cl.
    CPC ............ *B01F 23/454* (2022.01); *B01F 23/49* (2022.01); *B08B 3/00* (2013.01); *H01L 21/67017* (2013.01); *H01L 21/67034* (2013.01); *H01L 21/67051* (2013.01); *H01L 21/6708* (2013.01); *H01L 21/67253* (2013.01); *B01F 35/2211* (2022.01); *B01F 35/833* (2022.01); *Y10T 137/0396* (2015.04)

(56) References Cited

U.S. PATENT DOCUMENTS

| | | | |
|---|---|---|---|
| 2003/0230236 A1 | 12/2003 | Shibayama | |
| 2005/0271985 A1 | 12/2005 | Miya et al. | |
| 2007/0070803 A1* | 3/2007 | Urquhart | B01F 35/2132 |
| | | | 366/152.4 |
| 2008/0251107 A1* | 10/2008 | Osada | H01L 21/67051 |
| | | | 134/201 |
| 2009/0145463 A1* | 6/2009 | Oh | B01F 25/431 |
| | | | 134/201 |
| 2011/0220153 A1* | 9/2011 | Tanaka | H01L 21/67057 |
| | | | 134/61 |
| 2013/0306238 A1 | 11/2013 | Miura et al. | |
| 2016/0005630 A1 | 1/2016 | Fujiwara et al. | |
| 2016/0233082 A1 | 8/2016 | Yano et al. | |
| 2017/0014873 A1 | 1/2017 | Higuchi et al. | |

FOREIGN PATENT DOCUMENTS

| | | |
|---|---|---|
| JP | 2002-363775 A | 12/2002 |
| JP | 2003-332322 A | 11/2003 |
| JP | 2004-022572 A | 1/2004 |
| JP | 2005-175058 A | 6/2005 |
| JP | 2006-024890 A | 1/2006 |
| JP | 4368188 B2 | 11/2009 |
| JP | 2014-130940 A | 7/2014 |
| JP | WO 2015/136872 A1 | 9/2015 |
| JP | 2016-015395 A | 1/2016 |
| TW | 201347022 A | 11/2013 |
| TW | 201600183 A | 1/2016 |

OTHER PUBLICATIONS

International Search Report mailed Feb. 6, 2018 in corresponding PCT International Application No. PCT/JP2017/042645.
Written Opinion mailed Feb. 6, 2018 in corresponding PCT International Application No. PCT/JP2017/042645.
Office Action issued on Nov. 28, 2022 for corresponding Chinese Patent Application No. 201780080649.0.
PCT/IB/326 Notification Concerning Transmittal of International Preliminary Report on Patentability including P T/IB/373 and PCT/ISA/237 in Japanese) mailed Aug. 1, 2019 for International Application No. PCT/JP2017/042645.
PCT/IB/338 Notification of Transmittal of Translation of the International Preliminary Report on Patentability including PCT/IB/373 and PCT/ISA/237 (in English) mailed Aug. 1, 2019 for International Application No. PCT/JP2017/042645.

* cited by examiner

SUBSTRATE PROCESSING APPARATUS AND SUBSTRATE PROCESSING METHOD

TECHNICAL FIELD

The present invention relates to a technique for processing a substrate with a processing liquid.

BACKGROUND ART

In a process of manufacturing a semiconductor substrate (hereinafter, referred to simply as a "substrate"), conventionally, various processings are performed on the substrate with a processing liquid by using a substrate processing apparatus. For example, by supplying a chemical liquid onto a substrate having a surface on which a resist pattern is formed, a processing such as etching or the like is performed on the surface of the substrate. Further, after the etching process, also performed are processes of removing the resist on the substrate by using a stripping solution and cleaning the substrate by using a cleaning solution.

Further, Patent Publication No. 4368188 (Document 1) discloses a substrate processing apparatus which performs a processing on a substrate while immersing the substrate in a processing liquid in a processing bath. In the apparatus, on a path where the processing liquid overflowing from the processing bath is circulatively supplied to the processing bath, provided is an adjustment part for adjusting the nitrogen gas concentration in the processing liquid to a predetermined value. In the adjustment part, a supply path in which the processing liquid from the processing bath flows is branched into two systems, i.e., first and second supply paths, and then these two supply paths are joined and connected to the processing bath. In the first supply path, provided are a dissolution part for dissolving nitrogen gas into the processing liquid, a first nitrogen concentration meter, and a first processing liquid valve. In the second supply path, provided are a degassing part for releasing the nitrogen gas from the processing liquid, a second nitrogen concentration meter, and a second processing liquid valve. By controlling open/close of the first and second processing liquid valves on the basis of measured values of the first and second nitrogen concentration meters or the like, the processing liquid having a targeted nitrogen gas concentration is obtained and supplied to the processing bath.

In the substrate processing using a processing liquid, an etching rate of a film on a substrate varies due to the concentration of dissolved oxygen in the processing liquid. Though the dissolved oxygen concentration in the processing liquid stored in a tank can be reduced by bubbling of nitrogen gas in the processing liquid, decompressing the ambient atmosphere, or the like, it is difficult to adjust the dissolved oxygen concentration in the processing liquid to an arbitrary set value with high accuracy.

On the other hand, in the adjustment part disclosed in Document 1, though the processing liquid having a targeted nitrogen gas concentration can be obtained, the processing liquid disadvantageously contains a liquid having passed through a concentration measurement part. The liquid having passed through the concentration measurement part sometimes contains particles, metal ions, or the like which are caused by a liquid contacting part or the like of the concentration measurement part. It is not preferable that the liquid containing the particles or the like caused by the concentration measurement part is contained in the processing liquid to be supplied to the substrate.

SUMMARY OF INVENTION

The present invention is intended for a substrate processing apparatus for processing a substrate with a processing liquid, and it is an object of the present invention to prevent a liquid containing particles or the like caused by a concentration measurement part from being contained into a processing liquid to be supplied to a substrate and also to adjust a dissolved concentration of gas in the processing liquid to a set value with high accuracy.

The substrate processing apparatus according to the present invention includes a first supply liquid line in which a first supply liquid continuously flows, a first concentration measurement part provided in the first supply liquid line, for measuring a dissolved concentration of predetermined gas in the first supply liquid, a second supply liquid line in which a second supply liquid having a dissolved concentration of the gas which is lower than that of the first supply liquid continuously flows, a second concentration measurement part provided in the second supply liquid line, for measuring a dissolved concentration of the gas in the second supply liquid, a processing liquid adjustment part for mixing the first supply liquid and the second supply liquid, to thereby generate a processing liquid in which a dissolved concentration of the gas is adjusted, a substrate processing part for processing a substrate by supplying the substrate with the processing liquid, and a control part, and in the substrate processing apparatus, the processing liquid adjustment part includes a first branch line in which the first supply liquid flows and whose one end is connected to a connection position on the upstream side of the first concentration measurement part in the first supply liquid line, a second branch line in which the second supply liquid flows and whose one end is connected to a connection position on the upstream side of the second concentration measurement part in the second supply liquid line, a flow rate adjustment part provided in the first branch line or the second branch line, and a mixing part to which the other end of the first branch line and the other end of the second branch line are connected, for mixing the first supply liquid and the second supply liquid, to thereby generate the processing liquid, and the control part controls the flow rate adjustment part on the basis of a measured value of the first concentration measurement part and a measured value of the second concentration measurement part so that the dissolved concentration of the gas in the processing liquid becomes a set value.

According to the present invention, it is possible to prevent the supply liquid containing particles or the like caused by the concentration measurement part from being contained into the processing liquid to be supplied to the substrate and also to adjust the dissolved concentration of gas in the processing liquid to the set value with high accuracy.

In one preferred embodiment of the present invention, the processing liquid adjustment part further includes another flow rate adjustment part, the flow rate adjustment part adjusts a flow rate of the first supply liquid flowing in the first branch line, and the another flow rate adjustment part adjusts a flow rate of the second supply liquid flowing in the second branch line.

In another preferred embodiment of the present invention, the substrate processing part includes a substrate holding part for holding a substrate in a horizontal position and a nozzle for discharging the processing liquid toward the substrate.

In this case, preferably, the substrate processing part further includes another nozzle, and the substrate processing apparatus further includes a processing liquid adjustment part for the another nozzle, which mixes the first supply liquid and the second supply liquid, to thereby generate a processing liquid for the another nozzle, and in the substrate processing apparatus, the processing liquid adjustment part for the another nozzle includes a first branch line, a second branch line, a flow rate adjustment part, and a mixing part which have a similar structure to that of the first branch line, the second branch line, the flow rate adjustment part, and the mixing part of the processing liquid adjustment part, respectively, the control part controls the flow rate adjustment part of the processing liquid adjustment part for the another nozzle so that the dissolved concentration of the gas in the processing liquid for the another nozzle becomes a set value for the another nozzle, the nozzle discharges the processing liquid generated by the processing liquid adjustment part toward one main surface of the substrate, and the another nozzle discharges the processing liquid for the another nozzle toward the other main surface of the substrate.

In still another preferred embodiment of the present invention, the substrate processing apparatus further includes another substrate processing part for processing another substrate and a processing liquid adjustment part for the another substrate processing part, which mixes the first supply liquid and the second supply liquid, to thereby generate a processing liquid for the another substrate processing part, and in the substrate processing apparatus, the processing liquid adjustment part for the another substrate processing part includes a first branch line, a second branch line, a flow rate adjustment part, and a mixing part which have a similar structure to that of the first branch line, the second branch line, the flow rate adjustment part, and the mixing part of the processing liquid adjustment part, respectively, and the control part controls the flow rate adjustment part of the processing liquid adjustment part for the another substrate processing part so that the dissolved concentration of the gas in the processing liquid for the another substrate processing part becomes a set value for the another substrate processing part.

In one aspect of the present invention, the substrate processing apparatus further includes a first supply liquid tank for storing the first supply liquid, in which the first supply liquid is exposed to the gas and a second supply liquid tank for storing the second supply liquid and removing the gas from the second supply liquid, and in the substrate processing apparatus, the first supply liquid line together with the first supply liquid tank forms a first circulation flow path by taking in the first supply liquid from the first supply liquid tank and returning the first supply liquid to the first supply liquid tank, a filter is provided between the first concentration measurement part and the connection position in a flow direction of the first supply liquid in the first circulation flow path, the second supply liquid line together with the second supply liquid tank forms a second circulation flow path by taking in the second supply liquid from the second supply liquid tank and returning the second supply liquid to the second supply liquid tank, and a filter is provided between the second concentration measurement part and the connection position in a flow direction of the second supply liquid in the second circulation flow path.

In another aspect of the present invention, the substrate processing apparatus further includes a third supply liquid line in which a third supply liquid continuously flows and a third concentration measurement part provided in the third supply liquid line, for measuring a dissolved concentration of the gas in the third supply liquid, and in the substrate processing apparatus, the processing liquid adjustment part further includes a third branch line in which the third supply liquid flows, and whose one end is connected to a connection position on the upstream side of the third concentration measurement part in the third supply liquid line and the other end is connected to the mixing part and another flow rate adjustment part provided in one of the first to third branch lines, which is different from that in which the flow rate adjustment part is provided, and the first supply liquid and the second supply liquid are pure water and the third supply liquid is a liquid other than pure water, the first to third supply liquids are mixed by the mixing part, to thereby generate the third supply liquid diluted with pure water as the processing liquid, and the control part controls the flow rate adjustment part and the another flow rate adjustment part on the basis of respective measured values of the first to third concentration measurement parts so that the dissolved concentration of the gas in the processing liquid becomes the set value.

The present invention is also intended for a substrate processing method in a substrate processing apparatus.

These and other objects, features, aspects and advantages of the present invention will become more apparent from the following detailed description of the present invention when taken in conjunction with the accompanying drawings.

DESCRIPTION OF EMBODIMENTS

Figure 1:
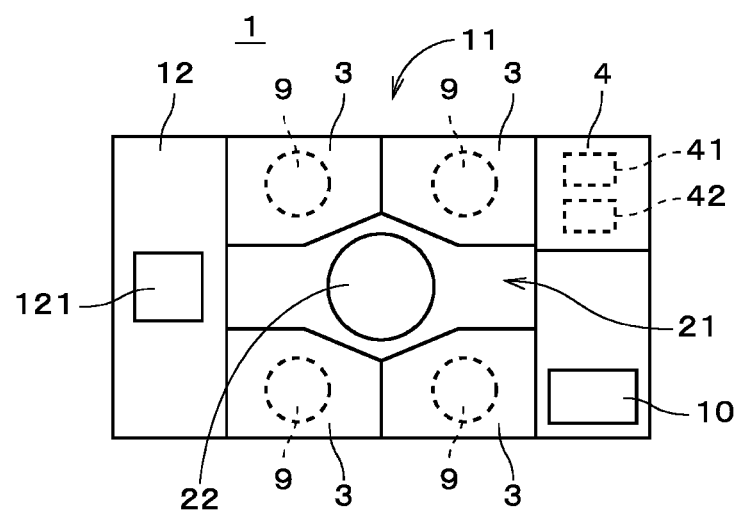
FIG. 1 is a plan view showing a substrate processing apparatus.

FIG. 1 is a plan view showing a substrate processing apparatus 1 in accordance with one preferred embodiment of the present invention. The substrate processing apparatus 1 is an apparatus for processing a semiconductor substrate 9 (hereinafter, referred to simply as a "substrate 9") having a substantially disk-like shape by supplying the substrate 9 with a processing liquid.

The substrate processing apparatus 1 includes a substrate processing unit 11, an indexer part 12, a supply liquid cabinet 4, and a control part 10. The control part 10 performs a general control of the substrate processing apparatus 1. The substrate processing unit 11 includes a plurality of substrate processing parts 3 and a transfer chamber 21. The plurality of substrate processing parts 3 are so arranged as to surround the transfer chamber 21. Though four substrate processing parts 3 are shown in FIG. 1, still more substrate processing parts 3 may be provided by stacking a plurality of substrate processing parts 3 in an up-and-down direction (direction perpendicular to the paper of FIG. 1). As described later, in each of the substrate processing parts 3, the substrate 9 is processed by supplying the processing liquid to the substrate 9. The transfer chamber 21 is a space spreading in a transverse direction of FIG. 1, and at the center of the transfer chamber 21, provided is a substrate transfer robot 22. The substrate transfer robot 22 performs loading of the substrate 9 into the substrate processing part 3 and unloading of the substrate 9 from the substrate processing part 3.

The indexer part 12 is arranged near an end portion on one side of the transfer chamber 21 spreading in the transverse direction. The indexer part 12 is provided with an indexer robot 121. In the indexer part 12, on the side opposite to the substrate processing unit 11, a not-shown cassette mounting part is provided. In the cassette mounting part, a plurality of cassettes are arrayed. In each of the cassettes, a plurality of substrates 9 are accommodated while being stacked in a multistage. The indexer robot 121 performs loading of the substrate 9 into each cassette and unloading of the substrate 9 from the cassette. Further, the indexer robot 121 passes the substrate 9 to/from the substrate transfer robot 22. The supply liquid cabinet 4 has a first supply liquid tank 41 and a second supply liquid tank 42. The first supply liquid tank 41 and the second supply liquid tank 42 are connected to each of the substrate processing parts 3 through processing liquid adjustment parts described later.

Figure 2:
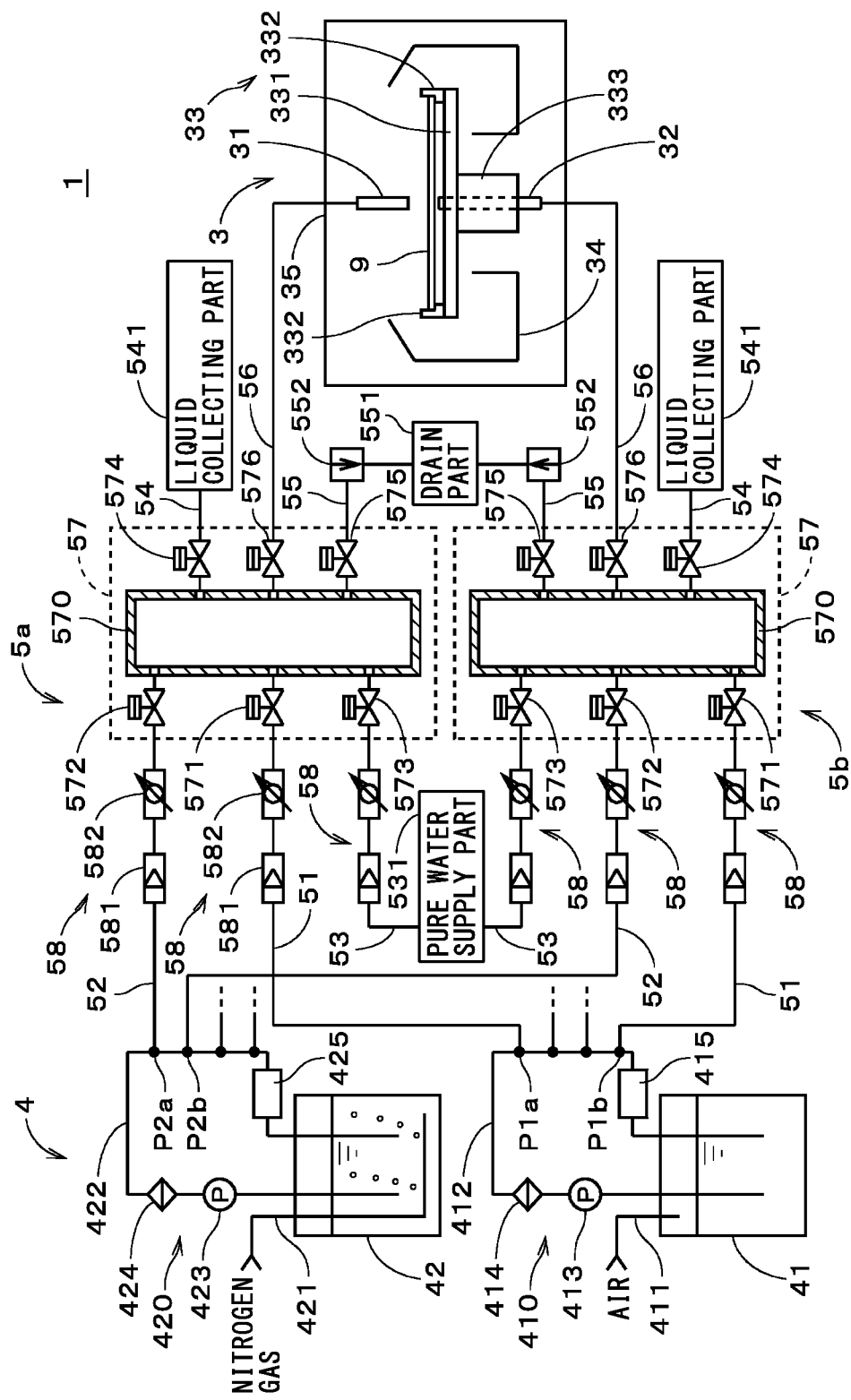
FIG. 2 is a view showing a configuration including a supply liquid cabinet, processing liquid adjustment parts, and a substrate processing part.

FIG. 2 is a view showing a configuration including the supply liquid cabinet 4, processing liquid adjustment parts 5a and 5b, and the substrate processing part 3. The substrate processing part 3 is a single-substrate processing unit for processing the substrates 9 one by one, and includes a substrate holding part 33, an upper nozzle 31, a lower nozzle 32, a cup 34, and a chamber 35. The substrate holding part 33 has a base part 331 having a disk-like shape with a central axis oriented in the up-and-down direction at the center. On an upper surface of the base part 331, provided are a plurality of chuck pins 332. The plurality of chuck pins 332 are disposed on a circumference with the central axis at the center. In order for the substrate holding part 33 to hold the substrate 9, the plurality of chuck pins 332 are pressed against a peripheral portion of the substrate 9. The substrate 9 is thereby held above the base part 331 in a horizontal position. The upper surface of the base part 331 is in parallel with a lower surface of the substrate 9, and the base part 331 and the substrate 9 are opposed to each other with a clearance therebetween.

To the center of a lower surface of the base part 331, attached is a shaft part 333 with the central axis at the center. When a not-shown substrate rotating mechanism rotates the shaft part 333, the substrate 9 together with the substrate holding part 33 rotates about the central axis. The base part 331 and the shaft part 333 are hollow. In hollow portions of the base part 331 and the shaft part 333, provided is the lower nozzle 32 extending in the up-and-down direction. As described later, the processing liquid adjustment part 5b for the lower nozzle 32 is connected to the lower nozzle 32 and the processing liquid is supplied from the processing liquid adjustment part 5b to the lower nozzle 32. The processing liquid is discharged upward from a discharge port provided at the center of an upper end surface of the lower nozzle 32.

The upper nozzle 31 is disposed above the substrate 9 and extends in the up-and-down direction. As described later, the processing liquid adjustment part 5a for the upper nozzle 31 is connected to the upper nozzle 31 and the processing liquid is supplied from the processing liquid adjustment part 5a to the upper nozzle 31. The processing liquid is discharged downward from a discharge port provided at the center of a lower end surface of the upper nozzle 31. The cup 34 has a substantially tubular shape surrounding a periphery of the base part 331. In the processing of the substrate 9 described later, the processing liquid spattering from the substrate 9 being rotated is received by an inner peripheral surface of the cup 34 and collected. The chamber 35 accommodates therein the substrate holding part 33, the upper nozzle 31, the lower nozzle 32, and the cup 34.

As described earlier, the supply liquid cabinet 4 has the first supply liquid tank 41 and the second supply liquid tank 42. The first supply liquid tank 41 stores therein a first supply liquid and the second supply liquid tank 42 stores therein a second supply liquid. The inside of the first supply liquid tank 41 is connected to the outside through an atmospheric open line 411. Specifically, the inside of the first supply liquid tank 41 is open to the atmosphere. The first supply liquid in the first supply liquid tank 41 is constantly exposed to oxygen in the air in principle, and in the first supply liquid, maintained is a state where the dissolved concentration of oxygen, i.e., the dissolved oxygen concentration is relatively high (almost saturated dissolved oxygen concentration). For example, the dissolved oxygen concentration in the first supply liquid is not lower than 9000 ppb.

To the second supply liquid tank 42, a nitrogen gas line 421 is connected. One end of the nitrogen gas line 421 is connected to a source of nitrogen gas and the other end thereof is disposed in the second supply liquid in the second supply liquid tank 42. At the other end of the nitrogen gas line 421, provided is a nozzle for bubble generation. When the source of nitrogen gas supplies nitrogen gas to the nitrogen gas line 421, bubbles of nitrogen gas are generated (bubbling) in the second supply liquid in the second supply liquid tank 42 and the nitrogen gas concentration in the second supply liquid is increased. Dissolved oxygen in the second supply liquid is thereby removed. In other words, the dissolved oxygen in the second supply liquid is degassed. The bubbling of nitrogen gas is constantly made in principle, and in the second supply liquid, maintained is a state where the dissolved oxygen concentration is relatively low. For example, the dissolved oxygen concentration in the second supply liquid is not higher than 50 ppb. Further, in the second supply liquid tank 42, the dissolved oxygen concentration in the second supply liquid may be reduced by pressure reduction or the like.

In the present exemplary processing, the first supply liquid and the second supply liquid are the same type of liquid and have different dissolved oxygen concentrations. Specifically, the dissolved oxygen concentration in the second supply liquid is lower than the dissolved oxygen concentration in the first supply liquid. The first supply liquid and the second supply liquid are, for example, SC1 (ammonia hydrogen peroxide mixture), SC2 (hydrochloric acid hydrogen peroxide mixture), SPM (sulfuric acid hydrogen peroxide mixture), hydrofluoric acid, buffered hydrofluoric acid (mixture of hydrofluoric acid and ammonium fluoride), or the like. Further, to the first supply liquid tank 41 and the second supply liquid tank 42, a not-shown supply liquid replenishment part is also connected, and when the supply liquids are reduced to a little amount in the first supply liquid tank 41 and the second supply liquid tank 42, the supply liquids are replenished into the first supply liquid tank 41 and the second supply liquid tank 42.

To the first supply liquid tank 41, connected is a first supply liquid line 412 which forms a first circulation flow path 410 together with the first supply liquid tank 41. Specifically, both ends of the first supply liquid line 412 are connected to the first supply liquid tank 41. In the first supply liquid line 412, provided is a pump 413. By driving the pump 413, the first supply liquid is taken into the first supply liquid line 412 from the first supply liquid tank 41. The first supply liquid continuously flows from one end of the first supply liquid line 412 to the other end thereof, and is returned to the first supply liquid tank 41. Thus, the first supply liquid circulates in the first circulation flow path 410. The circulation of the first supply liquid in the first circulation flow path 410 is constantly made in principle.

In the first supply liquid line 412, a filter 414 and a first concentration measurement part 415 are further provided. In the first supply liquid line 412, the filter 414 and the first concentration measurement part 415 are arranged in this order in a flow direction of the first supply liquid, i.e., from the above-described one end to the other end. The filter 414 removes particles contained in the first supply liquid. The filter 414 can remove a very small amount of metal (metal ion or the like) contained in the first supply liquid. The first concentration measurement part 415 is provided inline in the first supply liquid line 412 and has a liquid contacting part in contact with the first supply liquid flowing in the first supply liquid line 412. The first concentration measurement part 415 measures the dissolved oxygen concentration in the first supply liquid. A measured value of the first concentration measurement part 415 is outputted to the control part 10 every a predetermined time. Further, there may be a case where a heater or the like is provided in the first circulation flow path 410 and the temperature of the first supply liquid is adjusted (the same applies to the second circulation flow path 420 described later).

Like the first supply liquid line 412 of the first supply liquid tank 41, also to the second supply liquid tank 42, connected is a second supply liquid line 422. The second supply liquid line 422, together with the second supply liquid tank 42, forms a second circulation flow path 420. By driving a pump 423 provided in the second supply liquid line 422, the second supply liquid is taken into the second supply liquid line 422 from the second supply liquid tank 42. The second supply liquid continuously flows from one end of the second supply liquid line 422 to the other end thereof, and is returned to the second supply liquid tank 42. Thus, the second supply liquid circulates in the second circulation flow path 420. The circulation of the second supply liquid in the second circulation flow path 420 is constantly made in principle.

In the second supply liquid line 422, a filter 424 and a second concentration measurement part 425 are arranged in this order in a flow direction of the second supply liquid, i.e., from the above-described one end to the other end. Like the filter 414, the filter 424 removes particles and a very small amount of metal (metal ion or the like) which are contained in the second supply liquid. The second concentration measurement part 425 is provided inline in the second supply liquid line 422 and has a liquid contacting part in contact with the second supply liquid flowing in the second supply liquid line 422. The second concentration measurement part 425 measures the dissolved oxygen concentration in the second supply liquid. A measured value of the second concentration measurement part 425 is outputted to the control part 10 every a predetermined time.

The substrate processing apparatus 1 further includes the processing liquid adjustment part 5a for the upper nozzle 31 and the processing liquid adjustment part 5b for the lower nozzle 32. The processing liquid adjustment part 5a for the upper nozzle 31 includes a first branch line 51, a second branch line 52, a pure water introduction line 53, a liquid collecting line 54, a drain line 55, a nozzle liquid feed line 56, and a mixing part 57. One end of the first branch line 51 is connected to a connection position P1a between the filter 414 and the first concentration measurement part 415 in the first supply liquid line 412. As described earlier, since the first supply liquid flows from the side of the filter 414 to the first concentration measurement part 415 in the first supply liquid line 412, the connection position P1a is a position on the upstream side of the first concentration measurement part 415 in the first supply liquid line 412. The other end of the first branch line 51 is connected to the mixing part 57. Part of the first supply liquid flowing in the first supply liquid line 412 flows in the first branch line 51 and is supplied to the mixing part 57. In the first branch line 51, provided is a flow rate adjustment part 58. The flow rate adjustment part 58 includes a flowmeter 581 and a flow rate regulating valve 582. In the flow rate adjustment part 58, the degree of opening of the flow rate regulating valve 582 is controlled on the basis of an output value of the flowmeter 581, and the flow rate of the first supply liquid flowing in the first branch line 51 is thereby adjusted.

One end of the second branch line 52 is connected to a connection position P2a between the filter 424 and the second concentration measurement part 425 in the second supply liquid line 422. The connection position P2a is a position on the upstream side of the second concentration measurement part 425 in the second supply liquid line 422. The other end of the second branch line 52 is connected to the mixing part 57. Part of the second supply liquid flowing in the second supply liquid line 422 flows in the second branch line 52 and is supplied to the mixing part 57. Like in the first branch line 51, in the second branch line 52, provided is the flow rate adjustment part 58. The flow rate adjustment part 58 adjusts the flow rate of the second supply liquid flowing in the second branch line 52. The pure water introduction line 53 connects a pure water supply part 531 and the mixing part 57. Like in the first branch line 51, also in the pure water introduction line 53, provided is the flow rate adjustment part 58, which adjusts the flow rate of pure water (DIW: Deionized Water) flowing in the pure water introduction line 53.

The liquid collecting line 54 connects the mixing part 57 and a liquid collecting part 541. The drain line 55 connects the mixing part 57 and a drain part 551. In the drain line 55, provided is an ejector 552. By driving the ejector 552, a liquid in a mixing body 570 described later in the mixing part 57 is drained to the drain part 551 through the drain line 55. The nozzle liquid feed line 56 connects the mixing part 57 and the upper nozzle 31.

The mixing part 57 is, for example, a multiple valve device (mixing valve) and includes a mixing body 570 and a plurality of on-off valves 571 to 576. The mixing body 570 has an internal space for liquid mixing. The first branch line 51, the second branch line 52, the pure water introduction line 53, the liquid collecting line 54, the drain line 55, and the nozzle liquid feed line 56 described above are connected to the internal space of the mixing body 570 through the plurality of on-off valves 571 to 576, respectively. The open/close of each of the plurality of on-off valves 571 to 576 is controlled by the control part 10. The internal space of the mixing body 570 may be connected to other structures through other on-off valves.

The processing liquid adjustment part 5b for the lower nozzle 32 has a similar structure to that of the processing liquid adjustment part 5a for the upper nozzle 31. Specifically, the processing liquid adjustment part 5b for the lower nozzle 32 includes the first branch line 51, the second branch line 52, the pure water introduction line 53, the liquid collecting line 54, the drain line 55, the nozzle liquid feed line 56, and the mixing part 57. One end of the first branch line 51 is connected to a connection position P1b between the filter 414 and the first concentration measurement part 415 in the first supply liquid line 412 and the other end thereof is connected to the mixing part 57. In the first branch line 51, provided is the flow rate adjustment part 58. One end of the second branch line 52 is connected to a connection position P2b between the filter 424 and the second concentration measurement part 425 in the second supply liquid line 422, and the other end thereof is connected to the mixing part 57. In the second branch line 52, provided is the flow rate adjustment part 58. The pure water introduction line 53 connects the pure water supply part 531 and the mixing part 57. In the pure water introduction line 53, provided is the flow rate adjustment part 58.

The liquid collecting line 54 connects the mixing part 57 and the liquid collecting part 541. The drain line 55 connects the mixing part 57 and the drain part 551. In the drain line 55, provided is the ejector 552. The nozzle liquid feed line 56 connects the mixing part 57 and the lower nozzle 32. The mixing part 57 includes the mixing body 570 and the plurality of on-off valves 571 to 576. The first branch line 51, the second branch line 52, the pure water introduction line 53, the liquid collecting line 54, the drain line 55, and the nozzle liquid feed line 56 described above are connected to the internal space of the mixing body 570 through the plurality of on-off valves 571 to 576, respectively.

Figure 3A:
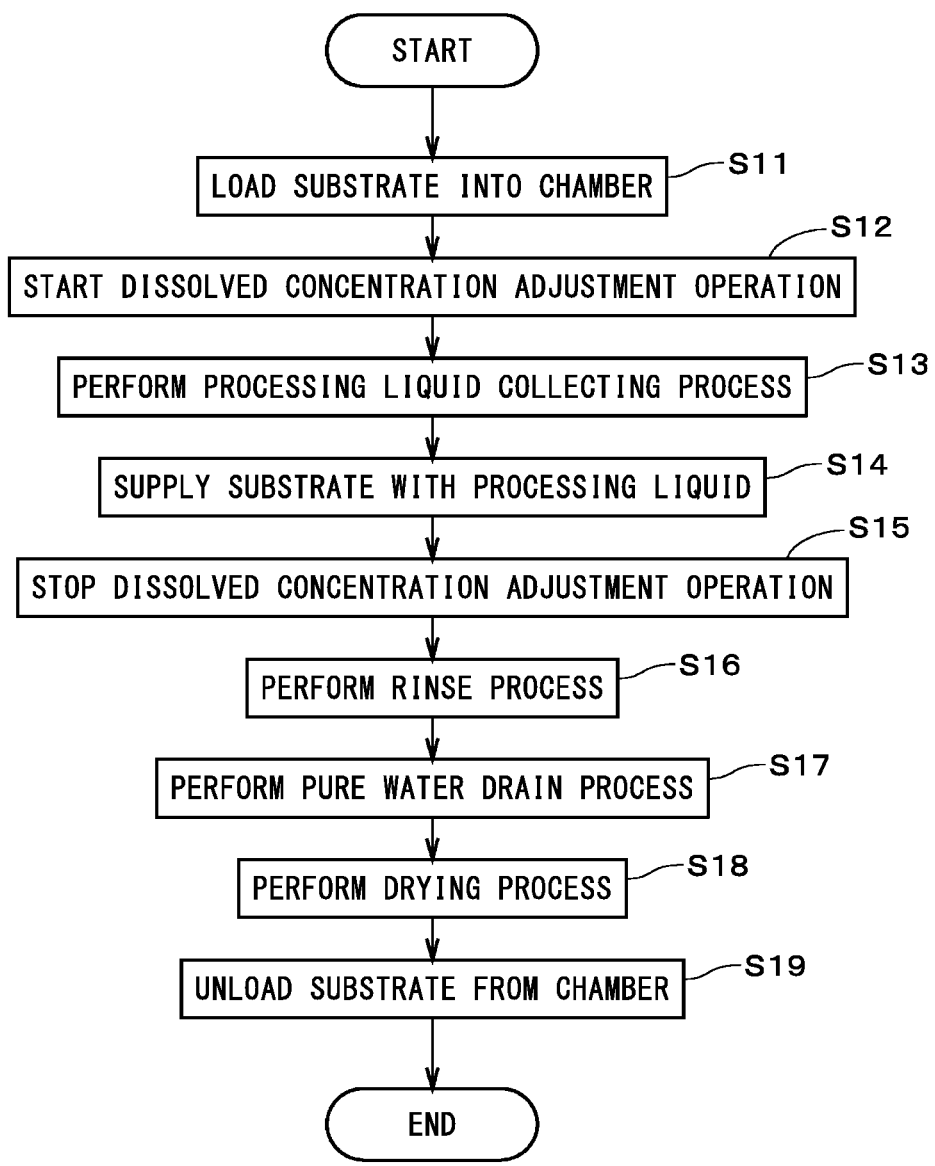
FIG. 3A is a flowchart showing an operation flow of processing a substrate in the substrate processing apparatus.

FIG. 3A is a flowchart showing an operation flow of processing the substrate 9 in the substrate processing apparatus 1. Hereinafter, the processing of the substrate 9 will be described, with attention paid to one substrate processing part 3. The processing shown in FIG. 3A is sequentially repeated for a plurality of substrates 9.

In the substrate processing part 3, the substrate 9 is transferred into the chamber by the substrate transfer robot 22 (see FIG. 1), and then held by the substrate holding part 33 (Step S11). The substrate 9 is rotated at a predetermined liquid processing speed by the substrate rotating mechanism. At that time, in the processing liquid adjustment part 5a for the upper nozzle 31 and the processing liquid adjustment part 5b for the lower nozzle 32, all the on-off valves 571 to 576 of the mixing part 57 are closed.

Subsequently, in each of the processing liquid adjustment parts 5a and 5b, the on-off valves 571 and 572 of the mixing part 57 are opened. The first supply liquid and the second supply liquid are thereby supplied into the internal space of the mixing body 570 and the processing liquid which is a mixed solution of the first supply liquid and the second supply liquid is generated in the internal space. In parallel with the generation of the processing liquid, in the processing liquid adjustment part 5a for the upper nozzle 31 and the processing liquid adjustment part 5b for the lower nozzle 32, a dissolved concentration adjustment operation is started (Step S12).

In the substrate processing apparatus 1, for the processing liquid to be discharged from the upper nozzle 31, a desired concentration value of dissolved oxygen is set in advance as a DO set value. The DO set value is a value between the dissolved oxygen concentration in the first supply liquid flowing in the first supply liquid line 412 and the dissolved oxygen concentration in the second supply liquid flowing in the second supply liquid. Further, the flow rate of the processing liquid to be discharged from the upper nozzle 31 is also set in advance as a flow rate set value. In the dissolved concentration adjustment operation, in the processing liquid adjustment part 5a for the upper nozzle 31, the respective flow rate adjustment parts 58 in the first branch line 51 and the second branch line 52 are controlled by the control part 10 so that the dissolved oxygen concentration in the processing liquid in (the internal space of) the mixing body 570 can become the DO set value and the flow rate of the processing liquid to be discharged from the mixing body 570 can become the flow rate set value at the discharge of the processing liquid described later.

The control over the respective flow rate adjustment parts 58 in the first and second branch lines 51 and 52 is performed on the basis of a measured value of the first concentration measurement part 415 and a measured value of the second concentration measurement part 425. Assuming that the measured value of the first concentration measurement part 415 is C1, the measured value of the second concentration measurement part 425 is C2, the DO set value for the upper nozzle 31 is C, and the flow rate set value is V, for example, the respective flow rate adjustment parts 58 of the first and the second branch lines 51 and 52 are controlled so that the flow rate X1 of the first supply liquid flowing in the first branch line 51 and the flow rate X2 of the second supply liquid flowing in the second branch line 52 can satisfy $(C1 \cdot X1 + C2 \cdot X2 = C \cdot V)$.

Figure 3B:
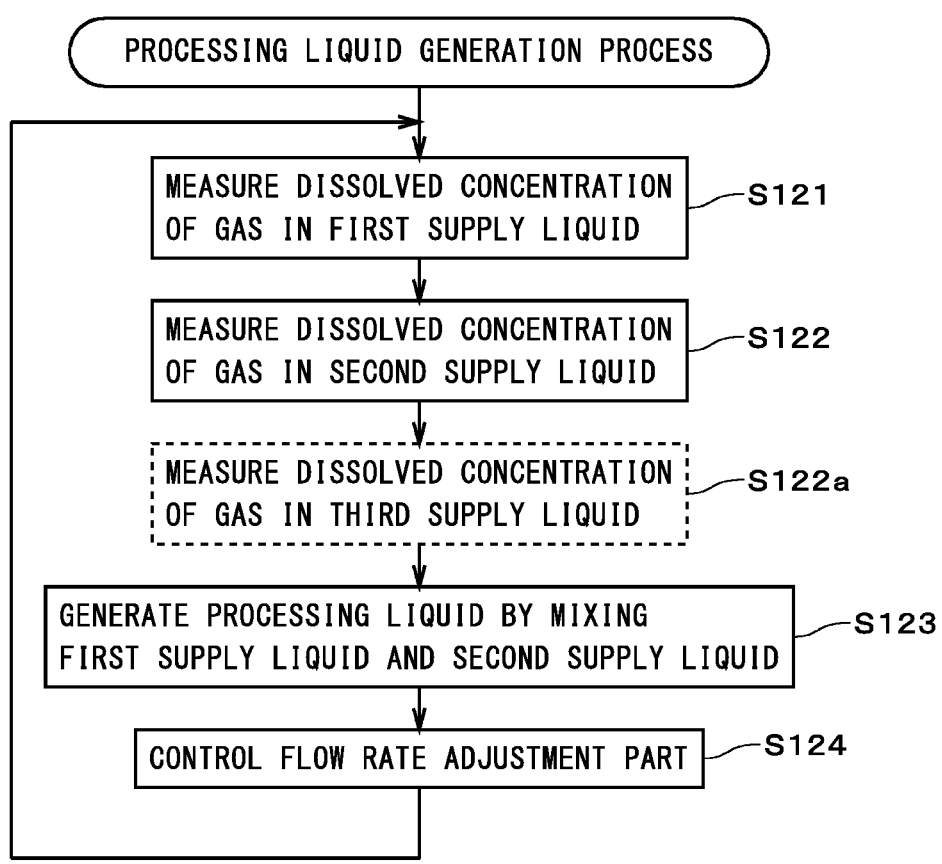
FIG. 3B is a flowchart showing an operation flow of generating a processing liquid.

Herein, paying attention to only the generation of the processing liquid for the upper nozzle 31, in the substrate processing apparatus 1, as shown in FIG. 3B, the measurement of the dissolved oxygen concentration in the first supply liquid by the first concentration measurement part 415 (Step S121), the measurement of the dissolved oxygen concentration in the second supply liquid by the second concentration measurement part 425 (Step S122), the generation of the processing liquid by mixing the first supply liquid and the second supply liquid in the mixing part 57 (Step S123), and the control over the flow rate adjustment parts 58 on the basis of the respective measured values of the first and second concentration measurement parts 415 and 425 (Step S124) are repeatedly performed in parallel with one another. Further, a process (Step S122a) indicated by a broken-line rectangle in FIG. 3B is performed in a substrate processing apparatus 1 shown in FIG. 5 described later.

Similarly, for the processing liquid to be discharged from the lower nozzle 32, a desired concentration value of dissolved oxygen is set in advance as another DO set value. Further, the flow rate of the processing liquid to be discharged from the lower nozzle 32 is also set in advance as another flow rate set value. The control part 10 controls the respective flow rate adjustment parts 58 in the first branch line 51 and the second branch line 52 so that the dissolved oxygen concentration in the processing liquid in the mixing body 570 can become another DO set value and the flow rate of the processing liquid to be discharged from the mixing body 570 can become another flow rate set value in the processing liquid adjustment part 5b for the lower nozzle 32. The control over the respective flow rate adjustment parts 58 in the first and second branch lines 51 and 52 is performed on the basis of a measured value of the first concentration measurement part 415 and a measured value of the second concentration measurement part 425. Like in the generation of the processing liquid for the upper nozzle 31, also in the generation of the processing liquid for the lower nozzle 32, the operation shown in FIG. 3B is performed.

In each of the processing liquid adjustment parts 5a and 5b, the on-off valve 574 of the mixing part 57 is also opened. The processing liquid in the mixing body 570 is thereby discharged to the liquid collecting part 541 through the liquid collecting line 54 (so-called pre-dispense). Specifically, a processing liquid collecting process in which the processing liquid in the mixing body 570 is collected by the liquid collecting part 541 is performed (Step S13). While the processing liquid collecting process is performed, in the processing liquid adjustment part 5*a* for the upper nozzle 31, the dissolved oxygen concentration of the processing liquid in the mixing body 570 becomes stabilized to be near the DO set value for the upper nozzle 31. Further, in the processing liquid adjustment part 5*b* for the lower nozzle 32, the dissolved oxygen concentration of the processing liquid in the mixing body 570 becomes stabilized to be near the DO set value for the lower nozzle 32. The processing liquid collected by the liquid collecting part 541 is subjected to, for example, a filtering process or the like, and then reused.

After a predetermined time has elapsed from the start of the processing liquid collecting process, the on-off valve 574 of the mixing part 57 is closed and the on-off valve 576 is opened. In the processing liquid adjustment part 5*a* for the upper nozzle 31, the processing liquid in the mixing body 570 is introduced to the upper nozzle 31 through the nozzle liquid feed line 56 and discharged toward the center of an upper surface of the substrate 9 (Step S14). The processing liquid in which the dissolved oxygen concentration is adjusted to the DO set value for the upper nozzle 31 is thereby continuously supplied onto the upper surface of the substrate 9 at the flow rate having the flow rate set value for the upper nozzle 31. Similarly, in the processing liquid adjustment part 5*b* for the lower nozzle 32, the processing liquid in the mixing body 570 is introduced to the lower nozzle 32 through the nozzle liquid feed line 56 and discharged toward the center of the lower surface of the substrate 9. The processing liquid in which the dissolved oxygen concentration is adjusted to the DO set value for the lower nozzle 32 is thereby continuously supplied onto the lower surface of the substrate 9 at the flow rate having the flow rate set value for the lower nozzle 32.

The processing liquid is spread toward peripheral portions of the upper surface and the lower surface of the substrate 9 by rotation. The processing using the processing liquid for the upper nozzle 31 is thereby performed on the upper surface of the substrate 9, and the processing using the processing liquid for the lower nozzle 32 is thereby performed on the lower surface of the substrate 9. The processing liquid spattering from an outer peripheral edge of the substrate 9 is received and collected by the cup 34. The processing liquid collected by the cup 34 may be reused.

After a predetermined time has elapsed from the start of the supply of the processing liquid, in each of the processing liquid adjustment parts 5*a* and 5*b*, the on-off valves 571 and 572 of the mixing part 57 are closed, and the discharges of the processing liquids from the upper nozzle 31 and the lower nozzle 32 are thereby stopped. Further, the control over the respective flow rate adjustment parts 58 in the first and second branch lines 51 and 52, i.e., the dissolved concentration adjustment operation is stopped (Step S15).

Subsequently, when the on-off valves 573 of the mixing parts 57 are opened, pure water is introduced into the mixing bodies 570 from the pure water supply part 531 through the pure water introduction lines 53. The pure water in the mixing bodies 570 is introduced to the upper nozzle 31 and the lower nozzle 32 through the nozzle liquid feed lines 56 and discharged toward the center of the upper surface and the center of the lower surface of the substrate 9. Thus, by continuously supplying the pure water onto the upper surface and the lower surface of the substrate 9, a rinse process is performed on the substrate 9 (Step S16). The pure water spattering from the outer peripheral edge of the substrate 9 being rotated is received and collected by the cup 34.

After a predetermined time has elapsed from the start of the supply of the pure water, in each of the processing liquid adjustment parts 5*a* and 5*b*, the on-off valve 573 of the mixing part 57 is closed and the discharges of the pure water from the upper nozzle 31 and the lower nozzle 32 are thereby stopped. Further, the on-off valve 575 is opened and driving of the ejector 552 is started. The pure water in the mixing body 570 is sucked (sucked back) into the drain line 55 and drained to the drain part 551. Specifically, a pure water drain process for draining the pure water in the mixing body 570 is performed (Step S17). Since the pure water in the mixing body 570 is removed, mixture of the pure water and the processing liquid in the mixing body 570 is suppressed in the processing for the next substrate 9. In the pure water drain process, the pure water remaining in the nozzle liquid feed line 56 is also removed to some degree. After a predetermined time has elapsed from the start of driving of the ejector 552, the on-off valves 575 and 576 are closed and the driving of the ejector 552 is also stopped.

In the substrate processing part 3, in parallel with the pure water drain process, the number of rotation of the substrate 9 is increased to a drying rate which is higher than the liquid processing speed. A drying process for removing the pure water on the substrate 9 is thereby performed (Step S18). After a predetermined time has elapsed from the start of the drying process, the rotation of the substrate 9 is stopped. In the substrate processing part 3, there may be a case where an IPA supply part is separately provided and the pure water on the substrate 9 is replaced with the IPA before the drying process. After the drying process, the substrate 9 is unloaded from the chamber 35 by the substrate transfer robot 22 (Step S19). In the substrate processing part 3, the processes in above-described Steps S11 to S19 are sequentially repeated on the plurality of substrates 9.

As described above, in the substrate processing apparatus 1, the first concentration measurement part 415 is provided in the first supply liquid line 412 in which the first supply liquid continuously flows, and the second concentration measurement part 425 is provided in the second supply liquid line 422 in which the second supply liquid continuously flows. To the first supply liquid line 412, one end of the first branch line 51 is connected, and to the second supply liquid line 422, one end of the second branch line 52 is connected. The other ends of the first and second branch lines 51 and 52 are connected to the mixing part 57, and by mixing the first supply liquid and the second supply liquid, the processing liquid is generated. The control part 10 controls the respective flow rate adjustment parts 58 in the first and second branch lines 51 and 52 on the basis of the respective measured values of the first and second concentration measurement parts 415 and 425 so that the dissolved oxygen concentration in the processing liquid can become the DO set value. It is thereby possible to adjust the dissolved oxygen concentration in the processing liquid to be supplied onto the substrate 9 to the DO set value with high accuracy.

Further, even when the dissolved oxygen concentrations in the first supply liquid and the second supply liquid flowing in the first and second supply liquid lines 412 and 422 vary, respectively, it is possible to adjust the dissolved oxygen concentration of the processing liquid to the DO set value with good responsiveness (quickly). In the substrate processing apparatus 1, it easily becomes possible to change the DO set value for every substrate 9 or change the DO set value during the supply of the processing liquid to one substrate 9.

The liquid having passed through the concentration measurement part sometimes contains particles, metal ions, or the like which are caused by the liquid contacting part or the like of the concentration measurement part or the like, and it is not preferable that the supply liquid containing the particles or the like caused by the concentration measurement part is contained in the processing liquid to be supplied to the substrate. On the other hand, in the substrate processing apparatus 1, the first branch line 51 is connected to the connection positions P1a and P1b on the upstream side of the first concentration measurement part 415 in the first supply liquid line 412, and the second branch line 52 is connected to the connection positions P2a and P2b on the upstream side of the second concentration measurement part 425 in the second supply liquid line 422. It is thereby possible to prevent the first supply liquid and the second supply liquid which contain the particles or the like caused by the first concentration measurement part 415 and the second concentration measurement part 425, respectively, from being contained in the processing liquid to be supplied onto the substrate 9, and as a result, it is possible to prevent contamination of the substrate 9 due to the processing liquid.

Further, the filter 414 is provided between the first concentration measurement part 415 and the connection positions P1a and P1b in the flow direction of the first supply liquid in the first circulation flow path 410. Furthermore, the filter 424 is provided between the second concentration measurement part 425 and the connection positions P2a and P2b in the flow direction of the second supply liquid in the second circulation flow path 420. It is thereby possible to appropriately remove the particles or the like in the first and second supply liquids having passed through the first and second concentration measurement parts 415 and 425 by the filters 414 and 424, respectively, and to prevent the particles from being contained in the processing liquid to be suppled onto the substrate 9.

Herein, there is a possible case where a filter for removing the particles or the like is provided in each of the branch lines 51 and 52. In this case, however, it becomes necessary to provide the filter in all the branch lines 51 and 52 connected to the first supply liquid line 412 and the second supply liquid line 422, respectively, and this increases the manufacturing cost of the substrate processing apparatus. Further, since the filter needs to be replaced, cleaned, and so on, also from the viewpoint of maintainability in the substrate processing apparatus 1, it is preferable that the number of filters should be less. In other words, in the substrate processing apparatus 1 in which the filters 414 and 424 are provided in the first and second supply liquid lines 412 and 422, respectively, it is possible to reduce the manufacturing cost of the substrate processing apparatus and increase the maintainability.

As described earlier, since the operation shown in FIG. 3A is repeated for the plurality of substrates 9, in the first and second branch lines 51 and 52, the first and second supply liquids flowing therein from the first and second supply liquid lines 412 and 422 in the processing of the previous substrate 9, respectively, are stagnated. In the first and second supply liquids which are stagnant, the dissolved oxygen concentration is sometimes changed, and in this case, immediately after the on-off valves 571 and 572 of the mixing part 57 are opened, the dissolved oxygen concentration in the processing liquid cannot be adjusted with high accuracy. In the substrate processing apparatus 1, by performing the processing liquid collecting process for collecting the processing liquid in the mixing body 570 before supplying the processing liquid onto the substrate 9, it is possible to prevent use of such a processing liquid for the processing of the substrate 9.

Further, the substrate processing apparatus 1 includes the processing liquid adjustment part 5a for the upper nozzle 31 and the processing liquid adjustment part 5b for the lower nozzle 32 which have similar structures. The control part 10 controls the respective flow rate adjustment parts 58 in the first and second branch lines 51 and 52 in the processing liquid adjustment part 5a so that the dissolved oxygen concentration in the processing liquid for the upper nozzle 31 can become the DO set value for the upper nozzle 31. The control part 10 also controls the respective flow rate adjustment parts 58 in the first and second branch lines 51 and 52 in the processing liquid adjustment part 5b so that the dissolved oxygen concentration in the processing liquid for the lower nozzle 32 can become the DO set value for the lower nozzle 32. Then, the processing liquid for the upper nozzle 31 which is generated by the processing liquid adjustment part 5a is discharged toward the upper surface of the substrate 9 from the upper nozzle 31, and the processing liquid for the lower nozzle 32 which is generated by the processing liquid adjustment part 5b is discharged toward the lower surface of the substrate 9 from the lower nozzle 32. It is thereby possible to supply both the surfaces of the substrate 9 with the processing liquid for the upper nozzle 31 and the processing liquid for the lower nozzle 32, respectively, in which the dissolved oxygen concentrations are individually adjusted with high accuracy and to appropriately process both the surfaces of the substrate 9. Furthermore, since the processing liquid adjustment parts 5a and 5b have similar structures, it is possible to easily design the substrate processing apparatus 1.

Figure 4:
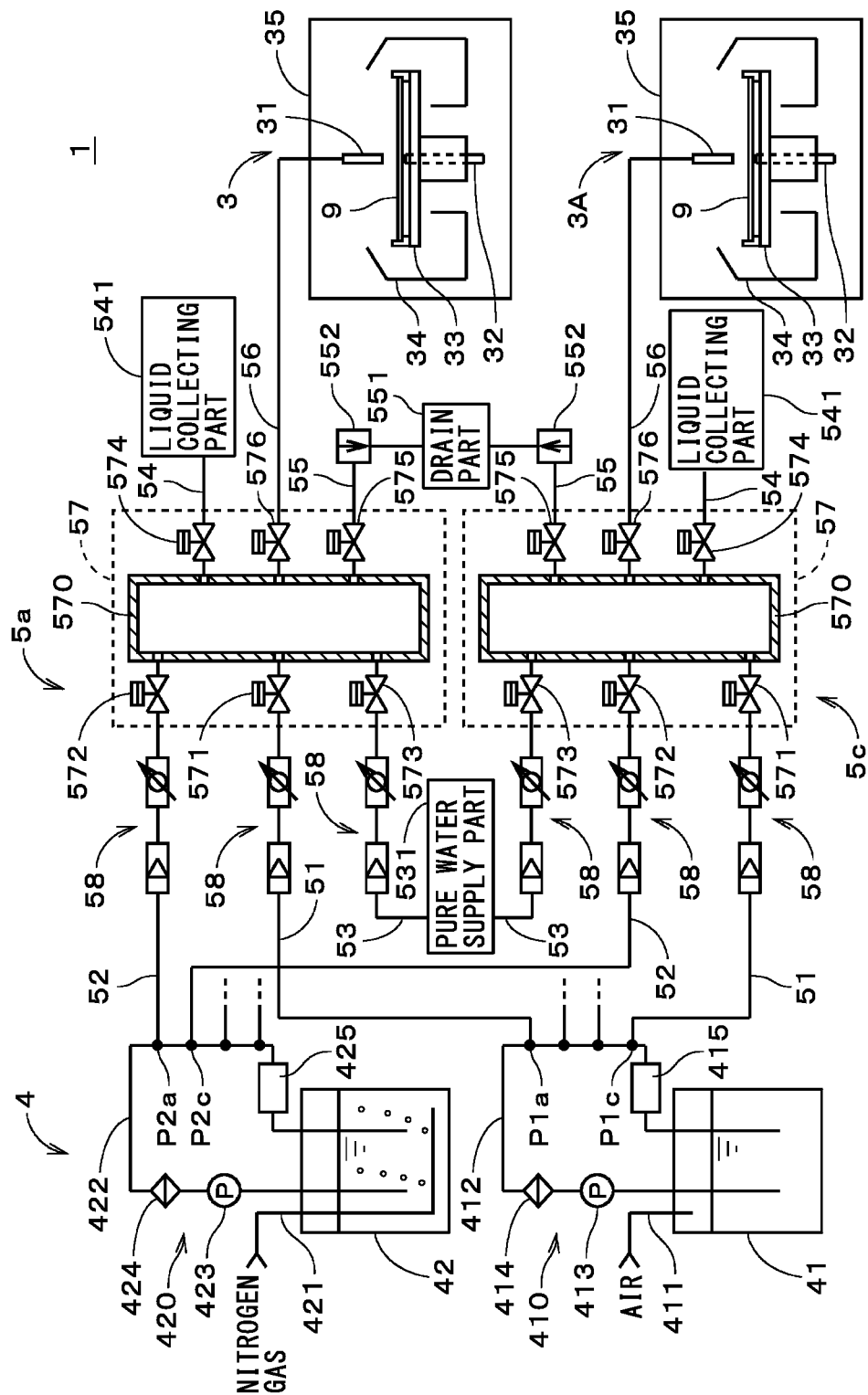
FIG. 4 is a view showing a configuration including two processing liquid adjustment parts connected to two substrate processing parts.

Though the processing of the substrate 9 has been described above with attention paid to one substrate processing part 3, in the substrate processing apparatus 1, the processing liquid adjustment part for another substrate processing part can be also provided. FIG. 4 is a view showing a configuration including the supply liquid cabinet 4, the processing liquid adjustment parts 5a and 5c, and two substrate processing parts 3 and 3A. The supply liquid cabinet 4, the processing liquid adjustment part 5a, and the substrate processing part 3 to which the processing liquid adjustment part 5a is connected are identical to the supply liquid cabinet 4, the processing liquid adjustment part 5a, and the substrate processing part 3 shown in FIG. 2, respectively.

The other substrate processing part 3A has a similar structure to that of the substrate processing part 3. Specifically, the substrate processing part 3A includes an upper nozzle 31, a lower nozzle 32, a substrate holding part 33, a cup 34, and a chamber 35 which have a similar structure to that of the upper nozzle 31, the lower nozzle 32, the substrate holding part 33, the cup 34, and the chamber 35 in the substrate processing part 3. The substrate processing part 3A is used for the processing of, for example, another substrate 9 which is different from the substrate 9 processed by the substrate processing part 3. To the upper nozzle 31 of the substrate processing part 3A, a processing liquid adjustment part 5c is connected, and to the lower nozzle 32, a not-shown processing liquid adjustment part is connected. In the following description, attention will be paid to the processing liquid adjustment parts 5a and 5c for the upper nozzles 31 of the substrate processing parts 3 and 3A, respectively, and the same applies to the processing liquid adjustment parts for the lower nozzles 32.

The processing liquid adjustment part 5c for the substrate processing part 3A has a similar structure to that of the processing liquid adjustment part 5a for the substrate processing part 3. Specifically, the processing liquid adjustment part 5c includes the first branch line 51, the second branch line 52, the pure water introduction line 53, the liquid collecting line 54, the drain line 55, the nozzle liquid feed line 56, and the mixing part 57. One end of the first branch line 51 is connected to a connection position P1c between the filter 414 and the first concentration measurement part 415 in the first supply liquid line 412, and the other end thereof is connected to the mixing part 57. In the first branch line 51, provided is the flow rate adjustment part 58. One end of the second branch line 52 is connected to a connection position P2c between the filter 424 and the second concentration measurement part 425 in the second supply liquid line 422, and the other end thereof is connected to the mixing part 57. In the second branch line 52, provided is the flow rate adjustment part 58. The pure water introduction line 53 connects the pure water supply part 531 and the mixing part 57. In the pure water introduction line 53, provided is the flow rate adjustment part 58.

The liquid collecting line 54 connects the mixing part 57 and the liquid collecting part 541. The drain line 55 connects the mixing part 57 and the drain part 551. In the drain line 55, provided is the ejector 552. The nozzle liquid feed line 56 connects the mixing part 57 and the upper nozzle 31 of the substrate processing part 3A. The mixing part 57 includes the mixing body 570 and the plurality of on-off valves 571 to 576. The first branch line 51, the second branch line 52, the pure water introduction line 53, the liquid collecting line 54, the drain line 55, and the nozzle liquid feed line 56 are connected to the internal space of the mixing body 570 through the plurality of on-off valves 571 to 576, respectively. Like in the processing liquid adjustment part 5a for the substrate processing part 3, in the processing liquid adjustment part 5c for the substrate processing part 3A, by mixing the first supply liquid and the second supply liquid in the mixing part 57, a processing liquid for the substrate processing part 3A is generated.

In the control part 10 of the substrate processing apparatus 1, the respective flow rate adjustment parts 58 of the first and second branch lines 51 and 52 in the processing liquid adjustment part 5a are controlled so that the dissolved oxygen concentration in the processing liquid for the substrate processing part 3 can become the DO set value for the substrate processing part 3. Actually, the flow rate of the processing liquid discharged from the mixing body 570 is also adjusted to the flow rate set value (the same applies to the processing liquid adjustment part 5c). Further, the respective flow rate adjustment parts 58 of the first and second branch lines 51 and 52 in the processing liquid adjustment part 5c are controlled so that the dissolved oxygen concentration in the processing liquid for the substrate processing part 3A can become the DO set value for the substrate processing part 3A. Then, the processing liquid generated by the processing liquid adjustment part 5a is supplied onto the substrate 9 in the substrate processing part 3, and the processing liquid generated by the processing liquid adjustment part 5c is supplied onto the substrate 9 in the substrate processing part 3A. It is thereby possible to supply different substrates 9 with the processing liquid for the substrate processing part 3 and the processing liquid for the substrate processing part 3A, respectively, in which the dissolved oxygen concentrations are individually adjusted with high accuracy and to appropriately process both the substrates 9. Furthermore, since the processing liquid adjustment parts 5a and 5c have similar structures, it is possible to easily design the substrate processing apparatus 1. Moreover, also in the generation of the processing liquid to be supplied onto the substrate 9 in the substrate processing part 3 and the generation of the processing liquid to be supplied onto the substrate 9 in the substrate processing part 3A, the operation shown in FIG. 3B is performed.

Figure 5:
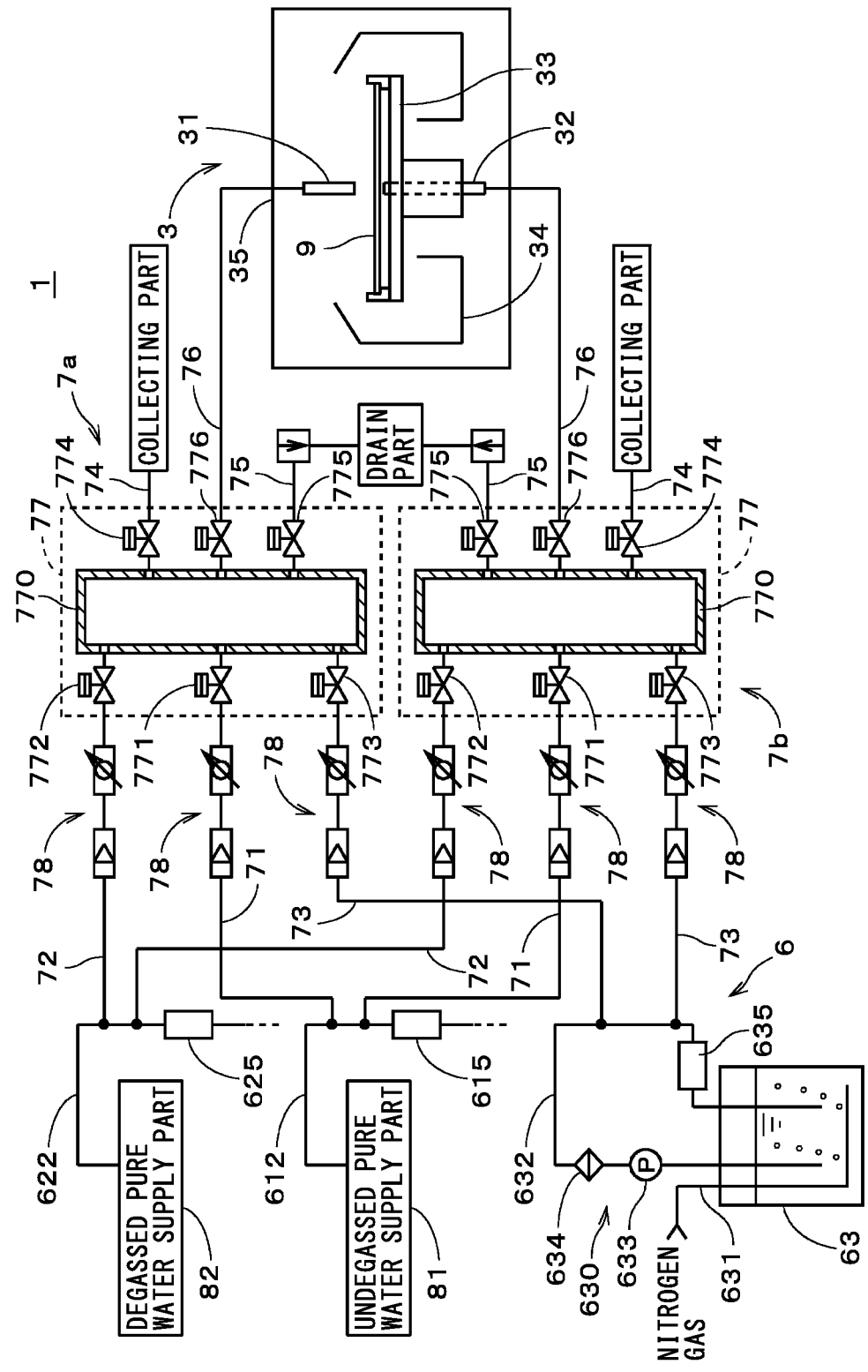
FIG. 5 is a view showing another exemplary substrate processing apparatus.

FIG. 5 is a view showing another exemplary substrate processing apparatus 1 and shows a configuration including a supply liquid cabinet 6, processing liquid adjustment parts 7a and 7b, and the substrate processing part 3. In the substrate processing apparatus 1 of FIG. 5, the supply liquid cabinet 6 and the processing liquid adjustment parts 7a and 7b have structures different from those of the supply liquid cabinet 4 and the processing liquid adjustment parts 5a and 5b shown in FIG. 2, respectively. Constituent elements other than the above are similar to those of FIG. 2, and the same constituent elements are represented by the same reference signs.

The supply liquid cabinet 6 has a third supply liquid tank 63. The third supply liquid tank 63 stores therein a third supply liquid. The third supply liquid is a liquid other than pure water and for example, a chemical liquid. In the third supply liquid tank 63, provided is a similar structure to that of the second supply liquid tank 42 shown in FIG. 2. Specifically, to the third supply liquid tank 63, a nitrogen gas line 631 is connected. By bubbling of nitrogen gas, dissolved oxygen in the third supply liquid is removed, and in other words, the dissolved oxygen in the third supply liquid is degassed. The bubbling of nitrogen gas is constantly made in principle, and in the third supply liquid, maintained is a state where the dissolved oxygen concentration is relatively low. For example, the dissolved oxygen concentration of the third supply liquid is not higher than 50 ppb.

To the third supply liquid tank 63, connected is a third supply liquid line 632. The third supply liquid line 632, together with the third supply liquid tank 63, forms a third circulation flow path 630. By driving a pump 633 provided in the third supply liquid line 632, the third supply liquid is taken into the third supply liquid line 632 from the third supply liquid tank 63. The third supply liquid continuously flows from one end of the third supply liquid line 632 to the other end thereof, and is returned to the third supply liquid tank 63. Thus, the third supply liquid circulates in the third circulation flow path 630. The circulation of the third supply liquid in the third circulation flow path 630 is constantly made in principle. In the third supply liquid line 632, a filter 634 and a third concentration measurement part 635 are arranged in this order in a flow direction of the third supply liquid. The filter 634 removes particles and a very small amount of metal (metal ion or the like) which are contained in the third supply liquid. The third concentration measurement part 635 is provided inline in the third supply liquid line 632 and measures the dissolved oxygen concentration in the third supply liquid.

The supply liquid cabinet 6 further includes a first supply liquid line 612 and a second supply liquid line 622. The first supply liquid line 612 is connected to an external undegassed pure water supply part 81, and the second supply liquid line 622 is connected to an external degassed pure water supply part 82. The undegassed pure water supply part 81 and the degassed pure water supply part 82 are, for example, facilities which are provided in a plant in which the substrate processing apparatus 1 is set up. The undegassed pure water supply part 81 continuously carries generated pure water (hereinafter, referred to as "undegassed pure water") in a circulation line provided in the plant so that the pure water can be supplied to each equipment in the plant without any change. The first supply liquid line 612 takes in the undegassed pure water from the circulation line for undegassed pure water and returns the undegassed pure water to the circulation line for undegassed pure water through a non-shown filter or the like. When the substrate processing apparatus 1 processes the substrate 9, in the first supply liquid line 612, the undegassed pure water continuously flows. Further, in the first supply liquid line 612, the undegassed pure water taken in from the circulation line for undegassed pure water may be disposed of, without being returned to the circulation line. (The same applies to the second supply liquid line 622).

The degassed pure water supply part 82 degases the pure water by using bubbling of nitrogen gas, a decompression module, or the like, and continuously carries degassed pure water in the circulation line provided in the plant so that the degassed pure water can be supplied to each equipment in the plant. The second supply liquid line 622 takes in the degassed pure water from the circulation line for degassed pure water and returns the degassed pure water to the circulation line for degassed pure water through a not-shown filter or the like. When the substrate processing apparatus 1 processes the substrate 9, in the second supply liquid line 622, the degassed pure water continuously flows. In the following description, the undegassed pure water flowing in the first supply liquid line 612 will be referred to as a "first supply liquid" and the degassed pure water flowing in the second supply liquid line 622 will be referred to as a "second supply liquid".

The first concentration measurement part 615 is provided inline in the first supply liquid line 612. The first concentration measurement part 615 measures the dissolved oxygen concentration in the first supply liquid. The second concentration measurement part 625 is provided inline in the second supply liquid line 622. The second concentration measurement part 625 measures the dissolved oxygen concentration in the second supply liquid. As described above, the second supply liquid is degassed pure water and the first supply liquid is undegassed pure water, and the dissolved oxygen concentration in the second supply liquid is lower than the dissolved oxygen concentration in the first supply liquid.

The processing liquid adjustment part 7a for the upper nozzle 31 includes a first branch line 71, a second branch line 72, a third branch line 73, a liquid collecting line 74, a drain line 75, a nozzle liquid feed line 76, and a mixing part 77. One end of the first branch line 71 is connected to a connection position on the upstream side of the first concentration measurement part 615 in the first supply liquid line 612. The connection position is a position that the first supply liquid passes before reaching the first concentration measurement part 615. The other end of the first branch line 71 is connected to the mixing part 77. Part of the first supply liquid flowing in the first supply liquid line 612 flows in the first branch line 71 and is supplied to the mixing part 77. In the first branch line 71, provided is a flow rate adjustment part 78. The flow rate adjustment part 78 has a similar structure to that of the flow rate adjustment part 58 shown in FIG. 2. The flow rate adjustment part 78 adjusts the flow rate of the first supply liquid flowing in the first branch line 71.

One end of the second branch line 72 is connected to a connection position on the upstream side of the second concentration measurement part 625 in the second supply liquid line 622. The other end of the second branch line 72 is connected to the mixing part 77. Part of the second supply liquid flowing in the second supply liquid line 622 flows in the second branch line 72 and is supplied to the mixing part 77. In the second branch line 72, provided is the flow rate adjustment part 78, which adjusts the flow rate of the second supply liquid flowing in the second branch line 72.

One end of the third branch line 73 is connected to a connection position between the filter 634 and the third concentration measurement part 635 in the third supply liquid line 632. The connection position is a position on the upstream side of the third concentration measurement part 635 in the third supply liquid line 632. The other end of the third branch line 73 is connected to the mixing part 77. Part of the third supply liquid flowing in the third supply liquid line 632 flows in the third branch line 73 and is supplied to the mixing part 77. In the third branch line 73, provided is the flow rate adjustment part 78. The flow rate adjustment part 78 adjusts the flow rate of the third supply liquid flowing in the third branch line 73. The liquid collecting line 74, the drain line 75, and the nozzle liquid feed line 76 are identical to the liquid collecting line 54, the drain line 55, and the nozzle liquid feed line 56 shown in FIG. 2, respectively.

Like the mixing part 57 shown in FIG. 2, the mixing part 77 includes a mixing body 770 and a plurality of on-off valves 771 to 776. The first branch line 71, the second branch line 72, the third branch line 73, the liquid collecting line 74, the drain line 75, and the nozzle liquid feed line 76 described above are connected to the internal space of the mixing body 770 through the plurality of on-off valves 771 to 776, respectively. In the mixing part 77, by mixing the first to third supply liquids, the third supply liquid diluted with pure water is generated as the processing liquid. The processing liquid adjustment part 7b for the lower nozzle 32 has a similar structure to that of the processing liquid adjustment part 7a for the upper nozzle 31.

In the substrate processing apparatus 1, for the processing liquid generated by each of the processing liquid adjustment parts 7a and 7b, a value of a desired dissolved oxygen concentration and a value of a desired dilution rate of the third supply liquid (chemical liquid) are set in advance as the DO set value and a dilution rate set value, respectively. The control part 10 controls the respective flow rate adjustment parts 78 in the first to third branch lines 71 to 73 in the processing liquid adjustment parts 7a and 7b so that the dissolved oxygen concentration in the processing liquid can become the DO set value and the dilution rate of the third supply liquid in the processing liquid can become the dilution rate set value. The control over the respective flow rate adjustment parts 78 in the first to third branch lines 71 to 73 is performed on the basis of respective measured values of the first to third concentration measurement parts 615, 625, and 635. Then, the processing liquids generated by the processing liquid adjustment parts 7a and 7b are supplied onto the upper surface and the lower surface of the substrate 9 in the substrate processing part 3, respectively. Actually, the flow rate of the processing liquid can be also adjusted to a desired flow rate set value.

Paying attention to only the generation of the processing liquid, in the substrate processing apparatus 1 of FIG. 5, the measurement of the dissolved oxygen concentration in the first supply liquid by the first concentration measurement part 615 (Step S121 in FIG. 3B), the measurement of the dissolved oxygen concentration in the second supply liquid by the second concentration measurement part 625 (Step S122), the measurement of the dissolved oxygen concentration in the third supply liquid by the third concentration measurement part 635 (Step S122a), the generation of the processing liquid by mixing the first to third supply liquids in the mixing part 77 (Step S123), and the control over the flow rate adjustment parts 78 on the basis of the respective measured values of the first to third concentration measurement parts 615, 625, and 635 (Step S124) are repeatedly performed in parallel with one another.

Thus, in the substrate processing apparatus 1 of FIG. 5, the respective flow rate adjustment parts 78 in the first to third branch lines 71 to 73 are controlled on the basis of the respective measured values of the first to third concentration measurement parts 615, 625, and 635. It is thereby possible to dilute the third supply liquid with pure water at the dilution rate set value with high accuracy and adjust the dissolved oxygen concentration in the processing liquid to the DO set value with high accuracy. Further, though the dissolved oxygen concentrations in the degassed pure water and the undegassed pure water flowing in the circulation lines inside the plant are unstable and sometimes largely vary, even in such a case, it is possible to adjust the dissolved oxygen concentration and the dilution rate of the processing liquid to be supplied to the substrate 9 with high accuracy.

In the substrate processing apparatus 1, in the first supply liquid line 612, the first branch line 71 is connected to the connection position on the upstream side of the first concentration measurement part 615, and in the second supply liquid line 622, the second branch line 72 is connected to the connection position on the upstream side of the second concentration measurement part 625. Further, in the third supply liquid line 631, the third branch line 73 is connected to the connection position on the upstream side of the third concentration measurement part 635. It is thereby possible to prevent the first to third supply liquids which contain the particles or the like caused by the first to third concentration measurement parts 615, 625, and 635, respectively, from being contained in the processing liquid to be supplied onto the substrate 9, and to prevent contamination of the substrate 9.

In the above-described substrate processing apparatus 1, various modifications can be made.

In the processing liquid adjustment parts 5a to 5c shown in FIGS. 2 and 4, the flow rate adjustment part 58 in one of the first and second branch lines 51 and 52 may be omitted. Also in this case, in accordance with the flow rate of the supply liquid in the one branch line, the flow rate adjustment part 58 in the other branch line can be controlled, and it is thereby possible to adjust the dissolved oxygen concentration in the processing liquid to the set value with high accuracy. Thus, in the processing liquid adjustment parts 5a to 5c, the flow rate adjustment part 58 has only to be provided in the first branch line 51 or the second branch line 52.

Similarly, in the processing liquid adjustment parts 7a and 7b shown in FIG. 5, the flow rate adjustment part 78 in one of the first to third branch lines 71 to 73 may be omitted. Also in this case, in accordance with the flow rate of the supply liquid in the one branch line, the flow rate adjustment parts 78 in the other branch lines can be controlled, and it is thereby possible to adjust the dissolved oxygen concentration in the processing liquid to the set value with high accuracy. Thus, in the processing liquid adjustment parts 7a and 7b, the flow rate adjustment part 78 has only to be provided in the first branch line 71 or the second branch line 72 and further, among the first to third branch lines 71 to 73, another flow rate adjustment part 78 has only to be provided in the branch line different from one in which the flow rate adjustment part 78 is provided.

On the other hand, in the processing liquid adjustment parts 5a to 5c shown in FIGS. 2 and 4, from the viewpoint of accurate adjustment of the flow rate of the processing liquid to be supplied to the substrate 9, it is preferable that the flow rate adjustment parts 58 should be provided in both the first and second branch lines 51 and 52. Similarly, in the processing liquid adjustment parts 7a and 7b shown in FIG. 5, from the viewpoint of accurate adjustment of the flow rate of the processing liquid to be supplied to the substrate 9, it is preferable that the flow rate adjustment parts 78 should be provided in all the first to third branch lines 71 to 73.

The processing liquid adjustment parts 5a to 5c shown in FIGS. 2 and 4 may be combined with the supply liquid cabinet 6 shown in FIG. 5. For example, the first branch line 51 is connected to the first supply liquid line 612 which is connected to the undegassed pure water supply part 81, and the second branch line 52 is connected to the second supply liquid line 622 which is connected to the degassed pure water supply part 82. The pure water in which the dissolved oxygen concentration is adjusted with high accuracy is thereby generated as a processing liquid. Further, like the first and second supply liquid lines 412 and 422 in the supply liquid cabinet 4 of FIG. 2, the first and second supply liquid lines 612 and 622 in the supply liquid cabinet 6 of FIG. 5 may be connected to the first and second supply liquid tanks. In this case, pure water is stored in the first and second supply liquid tanks. In the substrate processing apparatus 1 having the respective supply liquid tanks for the supply liquids, a large amount of processing liquid can be stably supplied to the substrate 9.

Though the processing liquid adjustment parts 5a to 5c, 7a and 7b adjust the dissolved oxygen concentration in the processing liquid in the above-described preferred embodiment, a dissolved concentration of other type of gas in the processing liquid may be adjusted. Also in this case, like in the above-described exemplary processing, the dissolved concentration of the gas in the supply liquid flowing in one of the two supply liquid lines is set lower than the dissolved concentration of the gas in the supply liquid flowing in the other supply liquid line. Further, concentration measurement parts each for measuring the dissolved concentration of the gas in the supply liquid are provided in the two supply liquid lines, respectively. Then, when the supply liquids are mixed through two branch lines connected to the two supply liquid lines, respectively, the flow rate adjustment parts provided in the two branch lines are controlled on the basis of respective measured values of the two concentration measurement parts. It thereby becomes possible to adjust the dissolved concentration of the gas in the processing liquid which is a mixed solution of the supply liquids to the set value with high accuracy.

In the substrate processing part of the substrate processing apparatus, the substrate may be processed by immersing the substrate in the processing liquid in the processing bath. Also in this case, by supplying the processing liquids (processing liquids in which the dissolved oxygen concentration is adjusted) generated by the mixing parts 57 and 77 in the processing liquid adjustment parts 5a to 5c, 7a, and 7b into the processing bath, it is possible to appropriately process the substrate 9. On the other hand, in the substrate processing apparatus having the processing bath, it is not easy to maintain the dissolved oxygen concentration in the processing liquid in the processing bath constant since the processing liquid in the processing bath is usually exposed to the air. Further, it is difficult to quickly change the dissolved oxygen concentration in the processing liquid in the processing bath. Therefore, in a case where it is intended to appropriately process the substrate 9 by using the processing liquid in which the dissolved oxygen concentration is adjusted to the set value with high accuracy or to sequentially process a plurality of substrates 9 by using processing liquids having different dissolved oxygen concentrations, it is preferable that the processing liquid should be discharged toward the substrate 9 from the nozzle connected to one of the processing liquid adjustment parts 5a to 5c, 7a, and 7b.

In a case where the mixing rate of the first supply liquid and the second supply liquid does not matter, the first supply liquid and the second supply liquid may be different types of liquids.

The substrate to be processed in the substrate processing apparatus 1 is not limited to a semiconductor substrate, but a glass substrate or any other substrate may be used.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
3, 3A Substrate processing part
5a to 5c, 7a, 7b Processing liquid adjustment part
9 Substrate
10 Control part
31 Upper nozzle
32 Lower nozzle
33 Substrate holding part
41 First supply liquid tank
42 Second supply liquid tank
51, 71 First branch line
52, 72 Second branch line
57, 77 Mixing part
58, 78 Flow rate adjustment part
73 Third branch line
410 First circulation flow path
412, 612 First supply liquid line
414, 424, 634 Filter
415, 615 First concentration measurement part
420 Second circulation flow path
422, 622 Second supply liquid line
425, 625 Second concentration measurement part
632 Third supply liquid line
635 Third concentration measurement part
P1a to P1c, P2a to P2c Connection position
S11 to S19, S121 to S124, S122a Step

The invention claimed is:

1. A substrate processing apparatus for processing a substrate with a processing liquid, comprising:
a first supply liquid line in which a first supply liquid continuously flows, said first supply liquid line forming a first circulation flow path;
a first concentration measurement part provided in said first supply liquid line, for measuring a dissolved concentration of a predetermined gas in said first supply liquid;
a first supply liquid tank for storing said first supply liquid, in which said first supply liquid is exposed to said gas;
a first filter provided in said first supply liquid line of said first circulation flow path;
a second supply liquid line in which a second supply liquid continuously flows, said second supply liquid line forming a second circulation flow path, wherein the second supply liquid has a dissolved concentration of said gas which is lower than that of said first supply liquid;
a second concentration measurement part provided in said second supply liquid line, for measuring a dissolved concentration of said gas in said second supply liquid;
a second supply liquid tank for storing said second supply liquid and removing said gas from said second supply liquid;
a second filter provided in said second supply liquid line of said second circulation flow path;
a first processing liquid adjustment part for mixing said first supply liquid and said second supply liquid, to thereby generate a first processing liquid in which a dissolved concentration of said gas is adjusted;
a first substrate processing part for processing a first substrate by supplying said first substrate with said first processing liquid; and
a control part,
wherein said first supply liquid line together with said first supply liquid tank forms said first circulation flow path by taking in said first supply liquid from said first supply liquid tank and returning said first supply liquid to said first supply liquid tank, and
said second supply liquid line together with said second supply liquid tank forms said second circulation flow path by taking in said second supply liquid from said second supply liquid tank and returning said second supply liquid to said second supply liquid tank,
wherein said first processing liquid adjustment part comprises:
a first branch line branched from said first circulation flow path so that said first supply liquid flows in said first branch line, wherein the first branch line comprises a first end that is directly connected to said first supply liquid line;
a second branch line branched from said second circulation flow path so that said second supply liquid flows in said second branch line, wherein the second branch line comprises a first end that is directly connected to said second supply liquid line;
a first flow rate adjustment part provided in said first branch line or said second branch line; and
a mixing part to which a second end of said first branch line and a second end of said second branch line are connected, for mixing said first supply liquid and said second supply liquid, to generate said first processing liquid, and
said control part controls said first flow rate adjustment part on a basis of a measured value of said first concentration measurement part and a measured value of said second concentration measurement part so that a dissolved concentration of said gas in said first processing liquid becomes a set value.

2. The substrate processing apparatus according to claim 1, wherein
in said first circulation flow path, said first filter is provided between said first concentration measurement part and a first connection position in a flow direction of said first supply liquid, wherein said first end of said first branch line is connected to said first connection position,
in said second circulation flow path, said second filter is provided between said second concentration measurement part and a second connection position in a flow direction of said second supply liquid, wherein said first end of said second branch line is connected to said second connection position.

3. The substrate processing apparatus according to claim 1, wherein
said first processing liquid adjustment part further comprises a second flow rate adjustment part,
said first flow rate adjustment part adjusts a flow rate of said first supply liquid flowing in said first branch line, and
said second flow rate adjustment part adjusts a flow rate of said second supply liquid flowing in said second branch line.

4. The substrate processing apparatus according to claim 1, wherein
said first substrate processing part comprises:
a substrate holding part for holding the first substrate in a horizontal position; and
a first nozzle for discharging said first processing liquid toward said first substrate.

5. The substrate processing apparatus according claim 4, wherein
said first substrate processing part further comprises a second nozzle,
said substrate processing apparatus further comprising:
a second processing liquid adjustment part for said second nozzle, which mixes said first supply liquid and said second supply liquid, to thereby generate a second processing liquid for said second nozzle,
wherein said second processing liquid adjustment part for said second nozzle comprises a third branch line, a forth branch line, a second flow rate adjustment part, and a mixing part,
said control part controls said second flow rate adjustment part of said second processing liquid adjustment part so that a dissolved concentration of said gas in said second processing liquid for said second nozzle becomes a set value for said second nozzle,
said first nozzle discharges said first processing liquid generated by said first processing liquid adjustment part toward one surface of said first substrate, and
said second nozzle discharges said second processing liquid toward a second surface of said first substrate.

6. The substrate processing apparatus according to claim 1, further comprising:
a second substrate processing part for processing a second substrate; and
a second processing liquid adjustment part for said second substrate processing part, which mixes said first supply liquid and said second supply liquid, to thereby generate a second processing liquid for said second substrate processing part,
wherein said second processing liquid adjustment part comprises a third branch line, a fourth branch line, a second flow rate adjustment part, and a mixing part, and
said control part controls said second flow rate adjustment part of said second processing liquid adjustment part so that a dissolved concentration of said gas in said second processing liquid becomes a set value for said second substrate processing part.

7. A substrate processing apparatus for processing a substrate with a processing liquid, comprising:
a first supply liquid line in which a first supply liquid continuously flows, said first supply liquid line forming a first circulation flow path;
a first concentration measurement part provided in said first supply liquid line, for measuring a dissolved concentration of a predetermined gas in said first supply liquid;
a first filter provided in said first supply liquid line of said first circulation flow path;
a second supply liquid line in which a second supply liquid continuously flows, said second supply liquid line forming a second circulation flow path, wherein the second supply liquid has a dissolved concentration of said gas which is lower than that of said first supply liquid;
a second concentration measurement part provided in said second supply liquid line, for measuring a dissolved concentration of said gas in said second supply liquid;
a second filter provided in said second supply liquid line of said second circulation flow path;
a third supply liquid line in which a third supply liquid continuously flows;
a third concentration measurement part provided in said third supply liquid line, for measuring a dissolved concentration of said gas in said third supply liquid;
a first processing liquid adjustment part for mixing said first supply liquid, said second supply liquid, and said third supply liquid, to thereby generate a first processing liquid in which a dissolved concentration of said gas is adjusted; and
a first substrate processing part for processing a first substrate by supplying said first substrate with said first processing liquid;
wherein said first processing liquid adjustment part comprises:
a first branch line branched from said first circulation flow path so that said first supply liquid flows in said first branch line, wherein the first branch line comprises a first end that is directly connected to said first supply liquid line;
a second branch line branched from said second circulation flow path so that said second supply liquid flows in said second branch line, wherein the second branch line comprises a first end that is directly connected to said second supply liquid line;
a third branch line in which said third supply liquid flows, wherein the third branch line comprises a first end that is directly connected to a connection position on said third supply liquid line, wherein said connection position is upstream of the third concentration measurement part;
a first flow rate adjustment part provided in said first branch line or said second branch line;
a second flow rate adjustment part provided in one of said first to third branch lines, wherein the one of said first to third branch lines is different from the branch line comprising the first flow rate adjustment part, and
a mixing part to which a second end of said first branch line, a second end of said second branch line, and a second end of said third branch line are connected, for mixing said first supply liquid, said second supply liquid, and said third supply liquid, to generate said first processing liquid,
and wherein said first supply liquid and second supply liquid are pure water and said third supply liquid is a liquid other than pure water, and
wherein a control part is configured to control said first flow rate adjustment part and said second flow rate adjustment part on a basis of respective measured values of said first to third concentration measurement parts so that a dissolved concentration of said gas in said first processing liquid becomes a set value.

* * * * *